(12) United States Patent
Kawada

(10) Patent No.: US 10,096,470 B2
(45) Date of Patent: Oct. 9, 2018

(54) METHOD OF PRODUCING A SILICON CARBIDE SINGLE-CRYSTAL SUBSTRATE BY EPITAXIAL GROWTH OF A SIC EPITAXIAL FILM ON A SIC SUBSTRATE

(71) Applicant: FUJI ELECTRIC CO., LTD., Kawasaki-shi, Kanagawa (JP)

(72) Inventor: Yasuyuki Kawada, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/468,848

(22) Filed: Mar. 24, 2017

(65) Prior Publication Data

US 2017/0200605 A1    Jul. 13, 2017

Related U.S. Application Data

(63) Continuation of application No. PCT/JP2015/079021, filed on Oct. 14, 2015.

(30) Foreign Application Priority Data

Oct. 31, 2014  (JP) .................................. 2014-223819

(51) Int. Cl.
*C30B 25/16* (2006.01)
*H01L 21/02* (2006.01)
(Continued)

(52) U.S. Cl.
CPC .... *H01L 21/02529* (2013.01); *C23C 16/0236* (2013.01); *C23C 16/325* (2013.01);
(Continued)

(58) Field of Classification Search
CPC ......... C30B 25/00; C30B 25/02; C30B 25/14; C30B 25/16; C30B 25/165; C30B 25/20; C30B 29/00; C30B 29/10; C30B 29/36; C23C 16/0236; C23C 16/325; C23C 16/45523; H01L 21/02529; H01L 21/02378; H01L 21/0262
USPC ................. 117/84–86, 88–89, 105, 937, 951
See application file for complete search history.

(56) References Cited

U.S. PATENT DOCUMENTS

2002/0014198 A1    2/2002  Kawahara et al.
2002/0056411 A1*   5/2002  Hara ...................... C30B 25/00
                                                                117/13
(Continued)

FOREIGN PATENT DOCUMENTS

JP    H08-188468 A    7/1996
JP    2002-226300 A   8/2002
(Continued)

OTHER PUBLICATIONS

Hiroshi Harima et al., "Characterization of 3C—SiC Epitaxial Layers on TiC(111) by Raman Scattering", Japanese Journal of Applied Physics, vol. 36, Part 1, No. 9A, pp. 5525-5531, Sep. 1997.

*Primary Examiner* — Kenneth A Bratland, Jr.
(74) *Attorney, Agent, or Firm* — Rabin & Berdo, P.C.

(57) ABSTRACT

A method of growing a single-crystal, silicon carbide epitaxial film on a silicon carbide substrate by chemical vapor deposition is disclosed that results in a stress value of the epitaxial film within ±7.8 MPa. For example, from the start of the growth of the epitaxial film until completion, introduction of a source gas including a gas containing silicon, a gas containing carbon, and a gas containing chlorine into a reaction chamber and performing epitaxial growth is alternately performed with suspension of the supply of the gas containing silicon and the gas containing carbon into the reaction chamber while furnace temperature is maintained as is during performing processing in a gas atmosphere containing only hydrogen, or hydrogen and hydrogen chloride, whereby the epitaxial film is grown. Employing such a method enables manufacture of a substrate having a silicon carbide epitaxial film with minimal warpage.

5 Claims, 4 Drawing Sheets

(51) Int. Cl.
*C23C 16/32* (2006.01)
*C23C 16/455* (2006.01)
*C23C 16/02* (2006.01)
*C30B 25/14* (2006.01)
*C30B 25/20* (2006.01)
*C30B 29/36* (2006.01)

(52) U.S. Cl.
CPC ........ *C23C 16/45523* (2013.01); *C30B 25/14* (2013.01); *C30B 25/165* (2013.01); *C30B 25/20* (2013.01); *C30B 29/36* (2013.01); *H01L 21/0262* (2013.01); *H01L 21/02378* (2013.01)

(56) References Cited

U.S. PATENT DOCUMENTS

| | | | |
|---|---|---|---|
| 2005/0160965 A1* | 7/2005 | Ohtani | C30B 25/00 117/13 |
| 2006/0115934 A1 | 6/2006 | Kim et al. | |
| 2006/0166414 A1* | 7/2006 | Carlson | H01L 21/02381 438/149 |
| 2007/0062441 A1 | 3/2007 | Koshka | |

FOREIGN PATENT DOCUMENTS

| | | |
|---|---|---|
| JP | 2008-522442 A | 6/2008 |
| JP | 2009-508799 A | 3/2009 |
| JP | 2012-175076 A | 9/2012 |
| JP | 2014-114192 A | 6/2014 |

* cited by examiner

FIG.3

|  | THICKNESS OF FILM GROWN PER SESSION | RAMAN LINE SHIFT AMOUNT (cm$^{-1}$) |
|---|---|---|
| EXAMPLE 2 | 12μm CONTINUOUSLY GROWN | -0.09 |
| EXAMPLE 3 | 6μm (6μm x 2 SESSIONS) | -0.05 |
| EXAMPLE 4 | 4μm (4μm x 3 SESSIONS) | -0.03 |
| EXAMPLE 5 | 2μm (2μm X 6 SESSIONS) | -0.02 |

FIG.4

|  | SUSPENSION PERIOD OF GAS SUPPLY | RAMAN LINE SHIFT AMOUNT (cm$^{-1}$) |
|---|---|---|
| EXAMPLE 6 | 15 SECONDS | -0.07 |
| EXAMPLE 7 | 30 SECONDS | -0.03 |
| EXAMPLE 8 | 1 MINUTE | -0.02 |
| EXAMPLE 9 | 2 MINUTES | -0.02 |

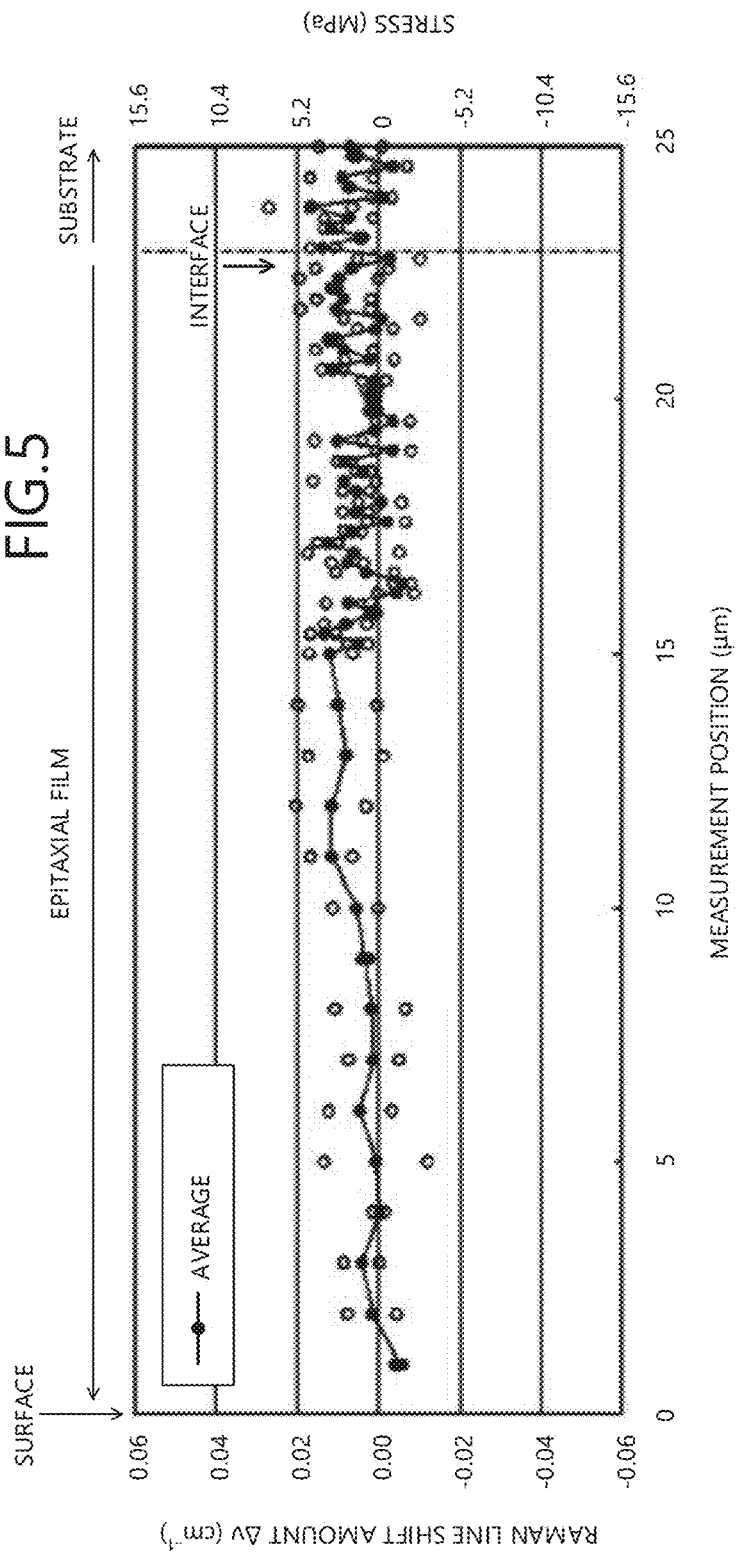

US 10,096,470 B2

METHOD OF PRODUCING A SILICON CARBIDE SINGLE-CRYSTAL SUBSTRATE BY EPITAXIAL GROWTH OF A SIC EPITAXIAL FILM ON A SIC SUBSTRATE

CROSS REFERENCE TO RELATED APPLICATIONS

This is a continuation application of International Application PCT/JP2015/079021 filed on Oct. 14, 2015, which claims priority from a Japanese Patent Application No. 2014-223819 filed on Oct. 31, 2014, the contents of both of which are incorporated herein by reference.

BACKGROUND OF THE INVENTION

1. Field of the Invention

Embodiments of the invention relate to a method of growing a silicon carbide epitaxial film.

2. Description of the Related Art

Compound semiconductors such as 4-layer periodic hexagonal silicon carbide (4H-SiC) are known as semiconductor materials. In producing a power semiconductor device using 4H-SiC as a semiconductor material, a 4H-SiC single-crystal film (hereinafter, SiC epitaxial film) is formed by epitaxial growth on a semiconductor substrate containing 4H-SiC (hereinafter, 4H-SiC substrate), and a SiC single-crystal substrate is produced. Conventionally, chemical vapor deposition (CVD) is known as an epitaxial growth method, for example, refer to Published Japanese-Translation of PCT Application, Publication No. 2009-508799.

In particular, epitaxial growth by CVD grows a SiC epitaxial film on a 4H-SiC substrate by thermally decomposing in a carrier gas, a source gas flowing in a reaction vessel (chamber) and continuously depositing silicon (Si) atoms following a crystal lattice of the 4H-SiC substrate. Typically, monosilane ($SiH_4$) gas and dimethylmethane ($C_3H_8$) gas are used as a source gas and hydrogen ($H_2$) gas is used as a carrier gas. Further, nitrogen ($N_2$) gas or trimethylaluminum (TMA) gas is suitably added as a doping gas.

SUMMARY OF THE INVENTION

According to one aspect of the present invention, a method of growing a silicon carbide epitaxial film includes, in the order recited, introducing into a reaction chamber, a source gas including a gas containing silicon, a gas containing carbon, and a gas containing chlorine; growing a single-crystal, silicon carbide epitaxial film on a silicon carbide substrate inside the reaction chamber by CVD; and suspending supply of the gas containing silicon and the gas containing carbon into the reaction chamber among the source gasses while maintaining a furnace temperature as is during performing processing in a gas atmosphere containing only hydrogen, or hydrogen and hydrogen chloride, wherein, introducing the source gas into the reaction chamber and growing by CVD are alternately performed with suspension of the supply of the gas containing silicon and the gas containing carbon while maintaining the furnace temperature and performing processing in the gas atmosphere, from a start of growth of the single-crystal, silicon carbide epitaxial film until completion.

In the method of growing a silicon carbide epitaxial film, a stress value is a value converted from a peak shift value when a cross-section of the single-crystal, silicon carbide epitaxial film is analyzed by a Raman spectrometer, along a line from an interface of the silicon carbide substrate and the single-crystal, silicon carbide epitaxial film to a surface of the single-crystal, silicon carbide epitaxial film, and the peak shift value is within ±0.03 $cm^{-1}$.

In the method of growing a silicon carbide epitaxial film, in introducing the source gas into the reaction chamber and performing the epitaxial growth, the single-crystal, silicon carbide epitaxial film grown per session has a thickness of 4 μm or less.

In the method of growing a silicon carbide epitaxial film, the supply of the gas containing silicon and the gas containing carbon into the reaction chamber among the source gas is suspended for a period of 30 seconds or longer.

In the method of growing a silicon carbide epitaxial film, the single-crystal, silicon carbide epitaxial film is grown on a silicon face of the silicon carbide substrate such that a stress value is within ±7.8 MPa.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a table of results of measurement of the Raman line shift amount in examples 2 to 5;

FIG. 4 is a table of results of measurement of the Raman line shift amount in examples 6 to 9; and FIG. 5 is a characteristics diagram of results of measurement of the Raman line shift amount in example 10.

DETAILED DESCRIPTION OF THE INVENTION

Embodiments of a method of growing a silicon carbide epitaxial film according to the present invention will be described in detail with reference to the accompanying drawings.

Figure 1A:
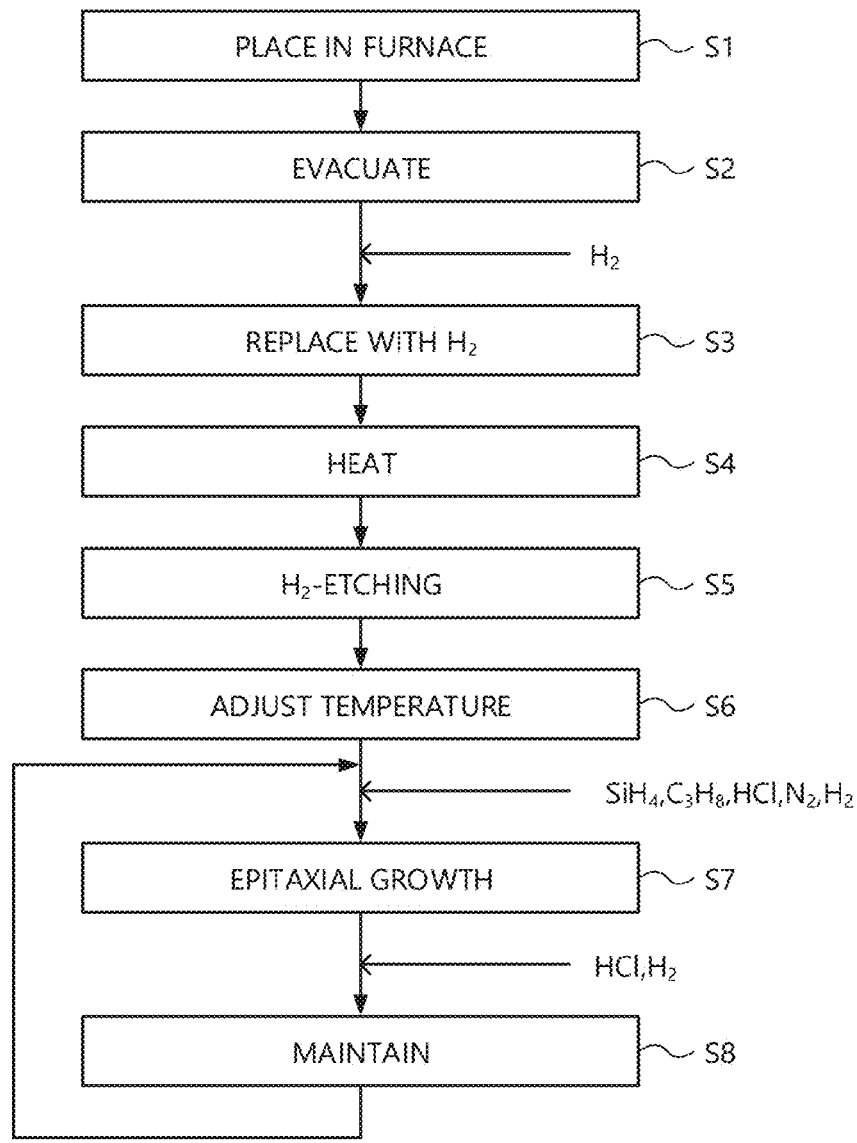
FIG. 1A is a process diagram of an example of a method of growing a silicon carbide epitaxial film according an embodiment.
Figure 1B:
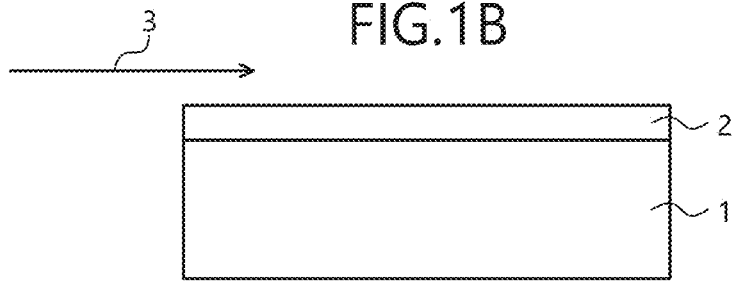
FIG. 1B is a cross-sectional view of a state of the silicon carbide epitaxial film during growth according to the embodiment.

FIG. 1A is a process diagram of an example of a method of growing a silicon carbide epitaxial film according an embodiment. FIG. 1B is a cross-sectional view of a state of the silicon carbide epitaxial film during growth according to the embodiment. A silicon carbide substrate 1 is prepared and the silicon carbide substrate 1 is cleaned well by a typical organic cleaning or RCA cleaning method. A 4-layer periodic hexagonal silicon carbide, Si face, 4-degree off-axis substrate may be given as an example of the silicon carbide substrate 1. The silicon carbide substrate 1 may be a substrate having another off angle.

As depicted in FIG. 1A, the silicon carbide substrate 1 is placed in a CVD furnace that grows a silicon carbide epitaxial film 2, and the silicon carbide substrate 1 is set on a susceptor (step S1). The furnace is evacuated until a degree of vacuum of, for example, $1\times10^{-3}$ Pa or lower is reached (step S2).

In the furnace, $H_2$ gas purified by a purifier is flowed at a rate of, for example, 20 L/minute for 15 minutes, for example, to replace the atmosphere within the furnace with $H_2$ gas (step S3). Thereafter, with $H_2$ gas being introduced into the furnace at a rate of, for example, 20 L/minute, the furnace is heated by, for example, high-frequency induction to a desired temperature of, for example, 1600 degrees C. (step S4). At this time, the temperature inside the furnace may be controlled by measuring the temperature using a radiation thermometer.

When the temperature inside the furnace reaches, for example, 1600 degrees C., this state is maintained for 10 minutes and the surface of the silicon carbide substrate 1 is $H_2$-etched (step S5). As a result, the surface of the silicon carbide substrate 1 becomes a surface suitable for epitaxial growth. Subsequently, the temperature inside the furnace is adjusted to a temperature for epitaxial growth such as 1630 degrees C. (step S6).

Next, inside the furnace, $SiH_4$ gas (for example, 50% $H_2$ dilution), $C_3H_8$ gas (for example, 20% $H_2$ dilution), HCl gas (for example, 100%), and a doping gas are introduced, and the silicon carbide epitaxial film 2 is grown on the silicon carbide substrate 1 (step S7). Here, the amount of the gases $SiH_4/H_2$ and $C_3H_8/H_2$ may be adjusted so that the Si and C element ratio (C/Si ratio), for example, becomes 1.3. Further, the amount of the gases $SiH_4/H_2$ and HCl may be adjusted so that the Si and Cl element ratio (Cl/Si ratio) becomes, for example, 3.0.

The gas flow rate may be, for example, 200 sccm for the $SiH_4/H_2$ gas, 166 sccm for the $C_3H_8/H_2$ gas, and 300 sccm for the HCl gas. The doping gas, for example, is $N_2$ gas and the flow rate of the $N_2$ gas may be adjusted so that the carrier concentration becomes, for example, $5\times10^{15}/cm^3$.

One example of a gas containing silicon is $SiH_4$. $C_3H_8$ is one example of a gas containing carbon. HCl is one example of a gas containing chlorine. FIG. 1B depicts collectively by an arrow 3, the gas supplied into the furnace, such as the gas containing silicon, the gas containing carbon, and the doping gas.

When the silicon carbide epitaxial film 2 has grown to a thickness to be grown per session, supply of the $SiH_4$ gas and the $C_3H_8$ gas into the furnace is suspended. The thickness of the silicon carbide epitaxial film 2 to be grown by epitaxial growth per session may be, for example, 4 μm or less preferably.

The furnace is set to have a $H_2$ gas atmosphere or a $H_2$ and HCl gas atmosphere, which is maintained for a predetermined period (step S8). The period that the supply of the $SiH_4$ gas and the $C_3H_8$ gas are suspended may be preferably, for example, 30 seconds or longer. Further, the period that the supply of the $SiH_4$ gas and the $C_3H_8$ gas are suspended may be preferably, for example, 2 minutes or less.

$SiH_4$ (for example, 50% $H_2$ dilution), $C_3H_8$ (for example, 20% $H_2$ dilution), HCl (for example, 100%), and the doping gas are again introduced into the furnace and the silicon carbide epitaxial film 2 is grown on the silicon carbide substrate 1 (step S7). Steps S7 to S8 are repeated until an overall thickness of the silicon carbide epitaxial film 2 becomes a desired thickness.

Example 1 is described. According to the method of growing a silicon carbide epitaxial film described in the embodiment, the silicon carbide epitaxial film 2 having a thickness of about 11.5 μm is grown on the silicon carbide substrate 1 of a 3-inch wafer, at a growth rate of about 40 μm/h. However, without performing step S8 depicted in FIG. 1, in the epitaxial growth of one session at step S7, the silicon carbide epitaxial film 2 having a thickness of about 11.5 μm is continuously grown.

Figure 2:
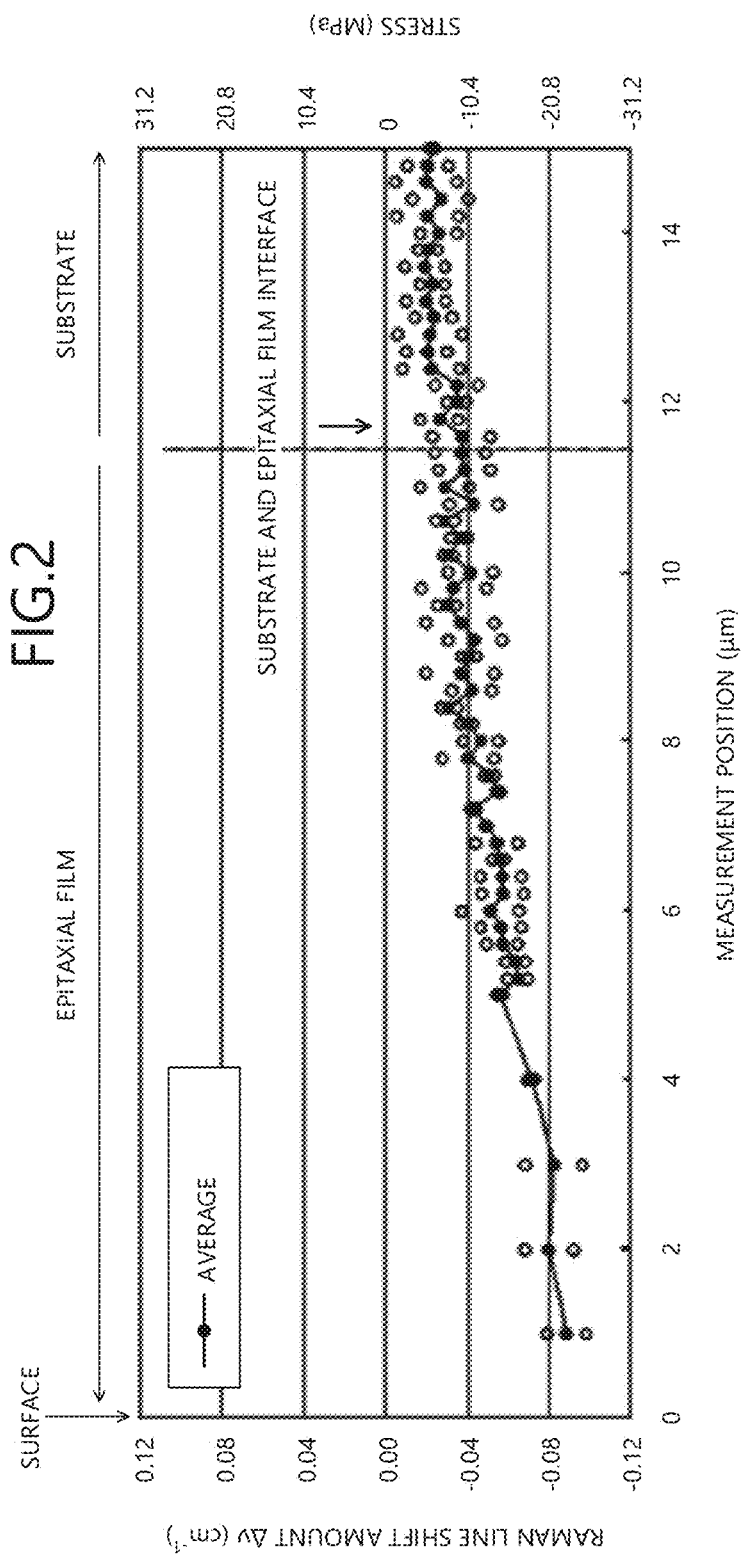
FIG. 2 is a characteristics diagram of results of measurement of Raman line shift amounts in example 1.

A central portion of the wafer after epitaxial growth was cut out and the cross-section was analyzed by micro-Raman spectroscopy. FIG. 2 depicts results of epitaxial film stress analysis of the cross-section by Raman spectroscopy.

FIG. 2 is a characteristics diagram of results of measurement of Raman line shift amounts in example 1. In FIG. 2, the vertical axes are Raman line shift amounts Δv (unit:$cm^{-1}$) and stress (unit:MPa) converted from Raman line shift amounts Δv; and the horizontal axis is measurement position (μm). Raman line shift amount Δv and stress have a relation expressed by equation (1).

$$\Sigma[Mpa]=\alpha\times\Delta v[cm^{-1}] \quad (1)$$

In equation (1), a has been reported to be 260 (Harima, H., et al, Jpn. J. Appl. Phys. 36, 5525 (1997)).

FIG. 2 depicts results of measurement of the Raman line shift amount Δv from the substrate side to the surface of the epitaxial film (position at a depth of 1 μm). Analysis wavenumber accuracy is ±0.02 $cm^{-1}$. In FIG. 2, plotted white circles are the results of measurements taken twice at the same position while plotted black circles and the line connecting them represents the average of the two measurements at each position.

From FIG. 2, it is clear that inside the substrate, the Raman line shift amount Δv is substantially constant at about −0.02 $cm^{-1}$, which is within a range of the wavenumber accuracy. It is found that inside the epitaxial film, the Raman line shift amount Δv gradually shifts on the negative side from a vicinity of the interface with the substrate toward the surface of the epitaxial film and increases with proximity to the surface.

Shifting of the Raman line shift amount Δv on the negative side means that tensile stress is generated. On the other hand, when compressive stress is generated, the Raman line shift amount Δv shifts on the positive side.

At a position 1 μm in depth from the surface of the epitaxial film, the Raman line shift amount Δv is −0.09 $cm^{-1}$ and thus, using equation (1) for conversion, tensile stress of about 23.4 MPa is generated. In this manner, when the epitaxial film becomes thick, stress that increases with proximity to the surface of the epitaxial film occurs and therefore, when a thick epitaxial film for high voltages is grown, a large stress is placed on the wafer.

Example 2 is described. According to the method of growing a silicon carbide epitaxial film described in the embodiment, the silicon carbide epitaxial film 2 having a thickness of about 12 μm was grown on the silicon carbide substrate 1, at a growth rate of 40 μm/h. However, without performing step S8 depicted in FIG. 1, the silicon carbide epitaxial film 2 having a thickness of about 12 μm by performing step S7 one time was continuously grown.

Example 3 is described. According to the method of growing a silicon carbide epitaxial film described in the embodiment, the silicon carbide epitaxial film 2 having a thickness of about 12 μm was grown on the silicon carbide substrate 1, at a growth rate of 40 μm/h, the growth of the silicon carbide epitaxial film 2 being divided into two sessions of 6 μm each. In other words, step S7, step S8, and step S7 were performed after step S6. At step S8, for 1 minute, the supply of the $SiH_4$ gas and the $C_3H_8$ gas was suspended and a hydrogen and hydrogen chloride atmosphere was maintained.

Example 4 is described. According to the method of growing a silicon carbide epitaxial film described in the embodiment, the silicon carbide epitaxial film 2 having a thickness of about 12 μm was grown on the silicon carbide substrate 1, at a growth rate of 40 μm/h, the growth of the silicon carbide epitaxial film 2 being divided into three sessions of 4 μm each. In other words, step S7, step S8, step S7, step S8, and step S7 were performed after step S6. At step S8, for 1 minute, the supply of the SiH$_4$ gas and the C$_3$H$_8$ gas was suspended and a hydrogen and hydrogen chloride atmosphere was maintained.

Example 5 is described. According to the method of growing a silicon carbide epitaxial film described in the embodiment, the silicon carbide epitaxial film 2 having a thickness of about 12 μm was grown on the silicon carbide substrate 1, at a growth rate of 40 μm/h, the growth of the silicon carbide epitaxial film 2 being divided into 6 sessions of 2 μm each. In other words, step S7, step S8, step S7, step S8, step S7, step S8, step S7, step S8, step S7, step S8, and step S7 were performed after step S6. At step S8, for 1 minute, the supply of the SiH$_4$ gas and the C$_3$H$_8$ gas was suspended and a hydrogen and hydrogen chloride atmosphere was maintained.

Concerning examples 2 to 5, a central portion of the wafer after the epitaxial growth was cut out and the cross-section was analyzed by micro-Raman spectroscopy. FIG. 3 is a table of results of measurement of the Raman line shift amount in examples 2 to 5. FIG. 3 depicts the results of measurement of the Raman line shift amount from the surface of the epitaxial film to a depth of 1 μm. As depicted in FIG. 3, the Raman line shift amount in example 2 was −0.09 cm$^{-1}$, the Raman line shift amount in example 3 was −0.05 cm$^{-1}$, the Raman line shift amount in example 4 was −0.03 cm$^{-1}$, and the Raman line shift amount in example 5 was −0.02 cm$^{-1}$.

By setting the thickness of the epitaxial film grown per session to be 4 μm or less, the Raman line shift amount may be reduced to −0.03 cm$^{-1}$. Accordingly, it was found that it is possible to reduce the tensile stress. Here, ±0.02 cm$^{-1}$ is the wavenumber accuracy including error. When the epitaxial film grown per session is made thinner, although the tensile stress reduction effect increases, the total time until the epitaxial film has a desired thickness increases and, thus, is not desirable from the point of throughput.

Accordingly, the thickness of the epitaxial film grown per session may be preferably about 4 μm, which is the maximum thickness that can keep the Raman line shift amount to be −0.03 cm$^{-1}$ or less.

Example 6 is described. According to the method of growing a silicon carbide epitaxial film described in the embodiment, the silicon carbide epitaxial film 2 having a thickness of 12 μm was grown on the silicon carbide substrate 1, at a growth rate of 40 μm/h, the growth of the silicon carbide epitaxial film 2 being divided into three sessions of 4 μm each. In other words, step S7, step S8, step S7, step S8, and step S7 were performed after step S6. At step S8, for 15 seconds, the supply of the SiH$_4$ gas and the C$_3$H$_8$ gas was suspended and a hydrogen and hydrogen chloride atmosphere was maintained.

Example 7 is described. Similar to example 6, the growth of the silicon carbide epitaxial film 2 on the silicon carbide substrate 1 was divided into three sessions of 4 μm each. At step S8, for 30 seconds, the supply of the SiH$_4$ gas and the C$_3$H$_8$ gas was suspended and a hydrogen and hydrogen chloride atmosphere was maintained.

Example 8 is described. Similar to example 6, the growth of the silicon carbide epitaxial film 2 on the silicon carbide substrate 1 was divided into three sessions of 4 μm each. At step S8, for 1 minute, the supply of the SiH$_4$ gas and the C$_3$H$_8$ gas was suspended and a hydrogen and hydrogen chloride atmosphere was maintained.

Example 9 is described. Similar to example 6, the growth of the silicon carbide epitaxial film 2 on the silicon carbide substrate 1 was divided into three sessions of 4 μm each. At step S8, for 2 minutes, the supply of the SiH$_4$ gas and the C$_3$H$_8$ gas was suspended and a hydrogen and hydrogen chloride atmosphere was maintained.

Concerning examples 6 to 9, a central portion of the wafer was cut out after the epitaxial growth and the cross-section was analyzed by micro-Raman spectroscopy. FIG. 4 is a table of results of measurement of the Raman line shift amount in examples 6 to 9. FIG. 4 depicts the results of measurement of the Raman line shift amount from the surface of the epitaxial film to a depth of 1 μm. As depicted in FIG. 4, the Raman line shift amount in example 6 was −0.07 cm$^{-1}$, the Raman line shift amount in example 7 was −0.03 cm$^{-1}$, the Raman line shift amount in example 8 was −0.02 cm$^{-1}$, and the Raman line shift amount in example 9 was −0.02 cm$^{-1}$.

By making the suspension period of the supply of the SiH$_4$ gas and the C$_3$H$_8$ gas at step S8 to be 30 seconds or longer, the Raman line shift amount may be reduced to −0.03 cm$^{-1}$. When the suspension period of the supply of the SiH$_4$ gas and the C$_3$H$_8$ gas is short, the state becomes close to a state when the epitaxial film is continuously grown and an effect of interrupting deposition of the epitaxial film part way through is reduced.

On the other hand, when the suspension period of the supply of the SiH$_4$ gas and the C$_3$H$_8$ as is long, the effect of interrupting deposition of the epitaxial film part way through is increased and the Raman line shift amount may be reduced to −0.02 cm$^{-1}$. However, since the total time until an epitaxial film having a desired thickness is obtained increases, this is not desirable from the point of throughput. Accordingly, the suspension period of the supply of the SiH$_4$ gas and the C$_3$H$_8$ gas may be preferably between 30 seconds and 1 minute.

Example 10 is described. According to the method of growing a silicon carbide epitaxial film described in the embodiment, step S7 and step S8 were repeated multiple times, and the silicon carbide epitaxial film 2 having a thickness of about 23 μm was grown on the silicon carbide substrate 1 of a 3-inch wafer. At step S7, the silicon carbide epitaxial film 2 was grown at a growth rate of about 40 μm/h to have a thickness of 4 μm per session. At step S8, at each session, the supply of the SiH$_4$ gas and the C$_3$H$_8$ gas was suspended for 1 minute.

A central portion of the wafer was cut out after the epitaxial growth and the cross-section was analyzed by micro-Raman spectroscopy. FIG. 5 depicts results of epitaxial film stress analysis of the cross-section by Raman spectroscopy.

FIG. 5 is a characteristics diagram of results of measurement of the Raman line shift amount in example 10. In FIG. 5, the vertical axes are Raman line shift amounts Δν (unit: cm$^{-1}$) and stress (unit: MPa) converted from the Raman line shift amount Δν using equation (1); and the horizontal axis is measurement position (μm).

FIG. 5 depicts results of measurement of the Raman line shift amount Δν from the substrate side to the surface of the epitaxial film (position at a depth of 1 μm). The analysis wave number accuracy is ±0.02 cm$^{-1}$. In FIG. 5, plotted white circles are the results of measurements taken twice at the same position while plotted black circles and the line connecting them represents the average of the two measurements at each position.

From FIG. 5, it is clear that from the interface of the substrate and the epitaxial film to the surface of the epitaxial film (position at a depth of 1 μm), the Raman line shift amount Δν is ±0.02 cm$^{-1}$. In other words, it was found that an epitaxial film was obtained in which neither tensile stress (Δν shifts on the negative side) nor compressive stress (Δν shifts on the positive side) was substantially generated.

As described, according to the method of growing a silicon carbide epitaxial film of the embodiment, tensile stress and compressive stress occurring in the silicon carbide epitaxial film grown on the silicon carbide substrate is reduced, enabling manufacture of a silicon carbide substrate having a silicon carbide epitaxial film with less warpage.

In the present invention, without limitation to embodiments described, various modifications are possible. For example, the values given in the embodiment and in the examples are examples and the present invention is not limited to these values. Further, the source gas described in the embodiment and in the examples is an example and another gas containing silicon, another gas containing carbon, or another gas containing chlorine may be used.

However, with the conventional epitaxial growth method, when a SiC epitaxial film having a thickness of 100 μm or more, which is necessary for producing a high-voltage device, is formed on a 4H-SiC substrate, stress of the SiC epitaxial film increases, arising in a problem of the substrate being susceptible to warpage. When the substrate warps and the substrate is placed into various processing apparatuses used in device production processes, significant problems occur such as defects from mounting (fixation); deviation in circuit pattern accuracy may occur with warpage in the photo process; and in a worst case, the substrate may crack during processing.

According to the present invention, the stress value of the single-crystal, silicon carbide epitaxial film is within ±7.8 MPa whereby warpage of the silicon carbide substrate having the single-crystal, silicon carbide epitaxial film is reduced.

According to the present invention, the peak shift value is within ±0.03 $cm^{-1}$ whereby the stress value obtained by conversion from the peak shift value is within ±7.8 MPa and, thus, warpage of the silicon carbide substrate having the single-crystal, silicon carbide epitaxial film is reduced.

According to the present invention, a single-crystal, silicon carbide epitaxial film in which neither tensile stress nor compressive stress substantially occurs is obtained whereby warpage of the silicon carbide substrate having the single-crystal, silicon carbide epitaxial film is reduced.

According to the present invention, tensile stress and compressive stress occurring in the single-crystal, silicon carbide epitaxial film are reduced whereby warpage of the silicon carbide substrate having the single-crystal, silicon carbide epitaxial film is reduced.

According to the present invention, tensile stress and compressive stress occurring in the single-crystal, silicon carbide epitaxial film are reduced whereby warpage of the silicon carbide substrate having the single-crystal, silicon carbide epitaxial film is reduced. When the suspension period of the supply of the gas that contains silicon and the gas that contains carbon is shorter than 30 seconds, the state becomes close to a state where the silicon carbide epitaxial film is continuously grown and therefore, tensile stress and compressive stress occurring in the single-crystal, silicon carbide epitaxial film is not reduced.

The method of growing a silicon carbide epitaxial film according to the present invention enables manufacture of a silicon carbide substrate having a single-crystal, silicon carbide epitaxial film having minimal warpage.

As described, the method of growing a silicon carbide epitaxial film according to the present invention is useful for a silicon carbide single-crystal substrate in which a silicon carbide single-crystal film is formed on a silicon carbide substrate, the silicon carbide single-crystal substrate being used when a device such as a diode or transistor using silicon carbide as a semiconductor material is produced. The method is particularly suitable for production of a silicon carbide single-crystal substrate having minimal substrate warpage consequent to mitigation of stress of the silicon carbide single-crystal film.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of growing a silicon carbide epitaxial film, comprising, in the order recited:
   introducing into a reaction chamber, a source gas including a gas containing silicon, a gas containing carbon, and a gas containing chlorine;
   growing a single-crystal silicon carbide epitaxial film on a silicon carbide substrate inside the reaction chamber by CVD; and
   suspending supply of the gas containing silicon and the gas containing carbon into the reaction chamber while maintaining a furnace temperature as is during performing processing in a gas atmosphere containing only hydrogen, or hydrogen and hydrogen chloride,
   wherein, introducing the source gas into the reaction chamber and growing by CVD are alternately performed with suspension of the supply of the gas containing silicon and the gas containing carbon while maintaining the furnace temperature and performing processing in the gas atmosphere, from a start of growth of the single-crystal, silicon carbide epitaxial film until completion, and
   wherein, in introducing the source gas into the reaction chamber and performing the epitaxial growth, the single-crystal silicon carbide epitaxial film grown per session has a thickness of 2 μm or more and 4 μm or less.

2. The method of growing a silicon carbide epitaxial film according to claim 1, wherein a stress value is a value converted from a peak shift value when a cross-section of the single-crystal, silicon carbide epitaxial film is analyzed by a Raman spectrometer, along a line from an interface of the silicon carbide substrate and the single-crystal silicon carbide epitaxial film to a surface of the single-crystal, silicon carbide epitaxial film, and the peak shift value is within ±0.03 $cm^{-1}$.

3. The method of growing a silicon carbide epitaxial film according to claim 1, wherein the supply of the gas containing silicon and the gas containing carbon into the reaction chamber is suspended for a period of 30 seconds or longer.

4. The method of growing a silicon carbide epitaxial film according to claim 1, wherein the single-crystal silicon carbide epitaxial film is grown on a silicon face of the silicon carbide substrate such that a stress value is within ±7.8 MPa.

5. The method of growing a silicon carbide epitaxial film according to claim 1, wherein the furnace temperature in the reaction chamber ranges from 1600-1630° C.

* * * * *